United States Patent
Lin

(10) Patent No.: US 10,297,740 B1
(45) Date of Patent: May 21, 2019

(54) CURVED ELECTRODE STRUCTURE

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventor: Po-Ching Lin, Guangdong (CN)

(73) Assignees: INTERFACE TECHNOLOGY (CHENGDU) CO., LTD., Sichuan (CN); INTERFACE OPTOELECTRONICS (SHENZHEN) CO., LTD., Guangdong (CN); GENERAL INTERFACE SOLUTION LIMITED, Miaoli County (TW)

( * ) Notice: Subject to any disclaimer, the term of this patent is extended or adjusted under 35 U.S.C. 154(b) by 0 days.

(21) Appl. No.: 15/981,877

(22) Filed: May 16, 2018

(30) Foreign Application Priority Data

Mar. 9, 2018 (CN) .......................... 2018 1 0194803

(51) Int. Cl.
*G06F 3/041* (2006.01)
*H01L 41/04* (2006.01)
*H01L 41/08* (2006.01)
*H01L 41/047* (2006.01)
*H01L 41/113* (2006.01)

(52) U.S. Cl.
CPC ........ *H01L 41/0477* (2013.01); *G06F 3/0414* (2013.01); *H01L 41/042* (2013.01); *H01L 41/081* (2013.01); *H01L 41/1132* (2013.01); *G06F 2203/04105* (2013.01)

(58) Field of Classification Search
CPC ............... H01L 41/0477; H01L 41/042; H01L 41/1132; H01L 41/081; G06F 3/0414; G06F 2203/04105
See application file for complete search history.

(56) References Cited

U.S. PATENT DOCUMENTS

2017/0317265 A1* 11/2017 Fudo ................... H01L 41/0477

* cited by examiner

*Primary Examiner* — Julia Slutsker
(74) *Attorney, Agent, or Firm* — CKC & Partners Co., LLC

(57) ABSTRACT

A curved electrode structure includes a piezoelectric material layer, a first conductive layer, a first protection layer and a second conductive layer. The piezoelectric material layer is disposed between the first conductive layer and the second conductive layer. The first conductive layer is disposed on the piezoelectric layer. Each of the first conductive layer and the piezoelectric material layer has a first contact surface. The two first contact surfaces are both circular shaped. The first protection layer is disposed on the conductive layer. Each of the first protection layer and the first conductive layer has a second contact surface. The two second contact surfaces are both circular shaped.

7 Claims, 4 Drawing Sheets

CURVED ELECTRODE STRUCTURE

CROSS-REFERENCE TO RELATED APPLICATION

This application claims priority to Chinese Application Serial Number 201810194803.3, filed Mar. 9, 2018, the disclosure of which is incorporated herein by reference in its entirety.

BACKGROUND

Along with high requirements of products with a touch sensing function, the relative software applications also have become more diverse. If a touch sensor can be designed as flexible and bendable, it can be further applied for physiological monitor devices.

Piezoelectric material is the most commonly used material for these products. When the piezoelectric material is deformed due to applied mechanical force, a charge variation will be induced in the piezoelectric material, which can be used for sensing pressure location and magnitude. The stress accumulated at the boundary of the electrode structure will induce negative pressure signals and cross talk phenomena, which makes it difficult to improve the precision and sensitivity of the sensor.

SUMMARY

One embodiment of the present invention is a curved electrode structure.

According to some embodiments of the present invention, the curved electrode structure includes piezoelectric material layer, first conductive layer, first protective layer, and second conductive layer. The first conductive layer is disposed on the piezoelectric layer. Each of the first conductive layer and the piezoelectric material layer has a first contact surface. The two first contact surfaces are both circular shaped. The first protection layer is disposed on the conductive layer. Each of the first protection layer and the first conductive layer has a second contact surface. The two second contact surfaces are both circular shaped. The piezoelectric material layer is disposed between the first conductive layer and the second conductive layer.

In some embodiments of the present invention, the first conductive layer forms a circular-shaped configuration when viewed from above.

In some embodiments of the present invention, the first protection layer has a protruding portion in contact with the first conductive layer, and a sidewall of the protruding portion has a circular-shaped profile.

In some embodiments of the present invention, the first protection layer has a flat portion, the protruding portion is located between the flat portion and the first conductive layer, and the flat portion completely overlaps with the piezoelectric material layer.

In some embodiments of the present invention, the protruding portion has a first width at a position adjacent to the flat portion, the first conductive layer has a second width at a position adjacent to the piezoelectric material layer, and the first width is greater than the second width.

In some embodiments of the present invention, a distance is formed between the flat portion and the piezoelectric material layer, the protruding portion has a radius of curvature at a position adjacent to the flat portion, and $A(R-t)=BR$, where A is the first width, R is the radius of curvature, t is the distance, and B is the second width.

In some embodiments of the present invention, a width of the first conductive layer and a width of the protruding portion are gradually increased from the piezoelectric material layer to the flat portion.

In some embodiments of the present invention, when the curved electrode structure is bent, the piezoelectric material layer, the first conductive layer, the first protection layer, and the second conductive layer have a same curvature.

In some embodiments of the present invention, the curved electrode structure further includes a second protection layer, the second conductive layer is disposed between the second protection layer and the piezoelectric material layer, and the second protection layer has the curvature.

In some embodiments of the present invention, a contact area between the first protection layer and the first conductive layer is greater than a contact area between the first conductive layer and the piezoelectric material layer.

In the foregoing embodiments of the present invention, since the two first contact surfaces of the first electrode layer and the piezoelectric material layer are in contact with each other and are both circular shaped, the two second contact surfaces of the first protective layer and the first conductive layer are in contact with each other and are both circular shaped, when the curved electrode structure is under pressure, the stress accumulation of the piezoelectric material can be reduced, unpredictable deformation due to the stress accumulation will be avoided and the cross talk phenomena will be reduced. Furthermore, areas of the electrode (e.g. first conductive layer and the piezoelectric material layer) which bent according to the same center of a circle reduced from the outer side to the inner side, thus the cross talk problem between electrodes can be reduced. Therefore, the curved electrode structure of the present invention can improve the precision and the sensitivity in pressure sensing.

DETAILED DESCRIPTION

Figure 1:
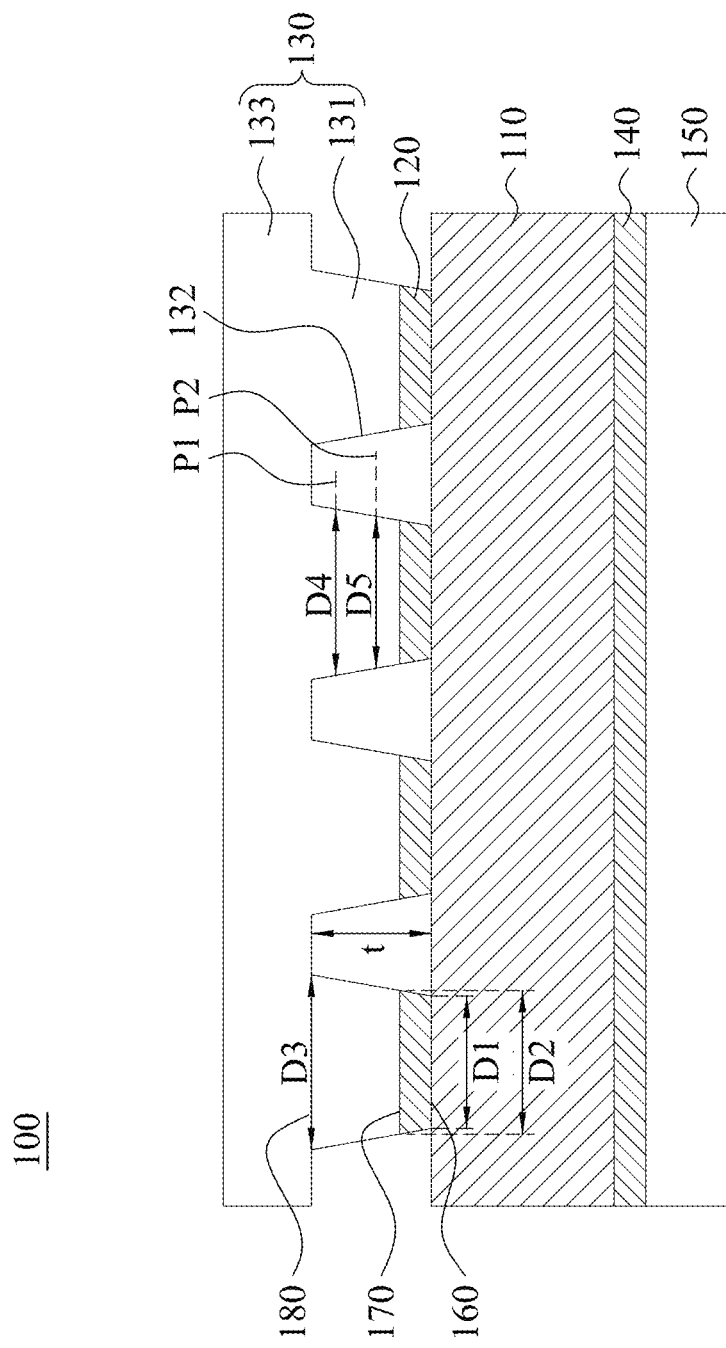
FIG. 1 is a cross-sectional view of a curved electrode structure according to one embodiment of the present disclosure.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Figure 2:
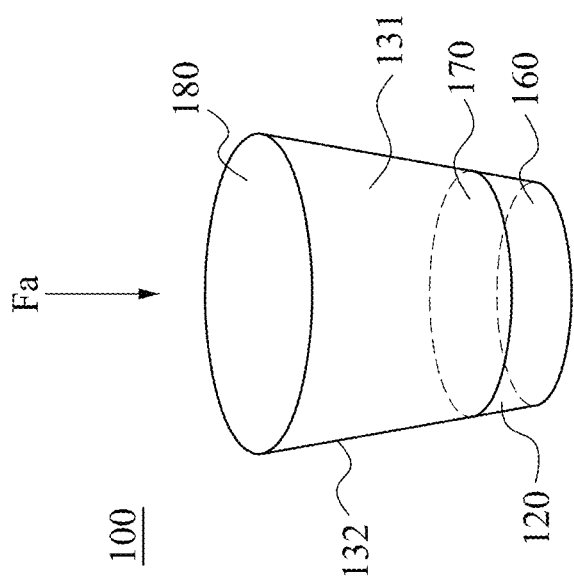
FIG. 2 is a part of the perspective view of the first protective layer and the first conductive layer of FIG. 1.

FIG. 1 is a cross-sectional view of a curved electrode structure according to one embodiment of the present disclosure. FIG. 2 is a part of the perspective view of the first protective layer and the first conductive layer of FIG. 1. Please refer to FIG. 1 and FIG. 2 simultaneously. The curved electrode structure 100 includes a piezoelectric material layer 110, a first conductive layer 120, a first protective layer 130, a second conductive layer 140 and a second protective layer 150. The piezoelectric material layer 110 is located between the first conductive layer 120 and the second conductive layer 140. Each of the first conductive layer 120 and the piezoelectric material layer 110 has a first contact surface 160, respectively. The two first contact surfaces 160 are in contact with each other and are both circular shaped. The first conductive layer 120 is located between the first protective layer 130 and the piezoelectric material 110. Each of the first protective layer 130 and the first conductive layer 120 has a second contact surface 170, respectively. The two second contact surfaces 170 are in contact with each other and are both circular shaped. The second conductive layer 140 is disposed between the piezoelectric material layer 110 and the second protective layer 150.

Since the two first contact surfaces 160 of the first electrode layer 120 and the piezoelectric material layer 110 are in contact with each other and are both circular shaped; the two second contact surfaces 170 of the first protective layer 130 and the first conductive layer 120 are in contact with each other and are both circular shaped, accumulated stress of the piezoelectric material 110 when the curved electrode structure is under pressure can be reduced, unpredictable deformation due to the accumulated stress will be avoided and the cross talk phenomena will be reduced. Therefore, the curved electrode structure 100 of the present invention can improve the precision and the sensitivity in pressure sensing.

In the present embodiment, the first conductive layer 120 of the curved electrode structure 100 forms a circular-shaped configuration when viewed from above. The first contact surface 160 which is the location where the first conductive layer 120 and the piezoelectric material layer 110 contacts with each other has a width D1. The second contact surface 170 which is the location where the first protective layer 130 and the first conductive layer 120 contacts with each other has a width D2. The width D2 of the second contact surface 170 is greater than the width D1 of the first contact surface 160. In the present embodiment, the width of the first conductive layer 120 gradually increase form the first contact surface 160 to the second contact surface 170. In other words, the size of the configuration of the first conductive layer 120 when viewed from above gradually increase from the first contact surface 160 to the second contact surface 170.

Furthermore, in the present embodiment, the first protective layer 130 of the curved electrode structure 100 has a protruding portion 131 and a flat portion 133. The protruding portion 131 is located at the lower half portion of the first protective layer 130, and the protruding portion 131 is adjacent to the first conductive layer 120. The second contact surface 170 of the first protective layer 130 is the bottom surface of the protruding portion 131. The protruding portion 131 has a sidewall 132, and the side wall 132 has a circular-shaped profile. The flat portion 133 is located at the upper half portion of the first protective layer 130. The flat portion 133 and the protruding portion 131 are connected at the connection surface 180. In other words, the protruding portion 131 is located between the flat portion 133 and the first conductive layer 120. The connection surface 180 has a width D3, and the width D3 of the connection surface 180 is greater than the width D2 of the second contact surface 170. In the present embodiment, the widths of the protruding portion 131 are gradually increased from the second contact surface 170 to the connection surface 180. In other words, the profile of the sidewall 132 of the protruding portion 131 gradually increases from the second contact surface 170 to the connection surface 180. Furthermore, the flat portion 133 completely overlaps with the piezoelectric material layer 110, and the flat portion 133 covers the protruding portion 131.

Particularly, in the present embodiment, the connection surface 180 between the protruding portion 131 which located from the first contact surface 160 to the first protective layer 130 and the flat portion 133 has a thickness t. Within a range of the thickness t, the protruding portion 131 of the first protective layer 130 has a width D4 at the position P1 adjacent to the flat portion 133, the protruding portion 131 of the first protective layer 130 has a width D5 at the position P2 adjacent to the piezoelectric material layer 110, and the width D4 is greater than the width D5.

In the present embodiment, since the width D3 of the connection surface 180 is greater than the width D2 of the second contact surface 170, and the width D2 of the second contact surface 170 is greater than the width D1 of the first contact surface 160, thus when the curved electrode structure 100 is bent and is under pressure, the disturbance between the electrodes can be avoided. Therefore, the curved electrode structure of the present invention can improve the precision and the sensitivity in pressure sensing.

Figure 3A:
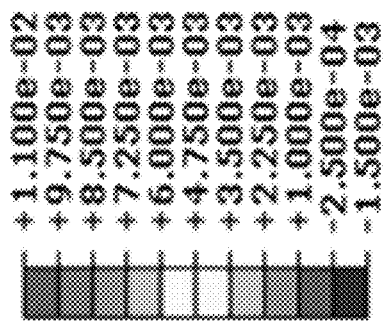
FIG. 3A is the stress distribution diagram when the curved electrode structure of FIG. 1 is under pressure.
Figure 3A:
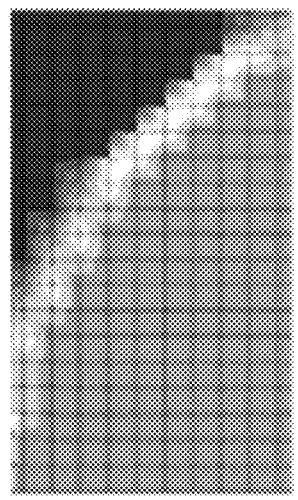

FIG. 3A is the stress distribution diagram when the curved electrode structure of FIG. 1 is under pressure. Referring to FIG. 2 and FIG. 3A simultaneously, the curved electrode structure 100 includes the first conductive layer 120, the protruding portion 131 of the first protective layer 130, the first contact surface 160, the second contact surface 170, the connection surface 180 and the sidewall 132 of the protruding portion 131. The first contact surface 160, the second contact surface 170 and the connection surface 180 of the curved electrode structure 100 are circular shaped, and the profile of the sidewall 132 of the protruding portion 131 is circular shaped. In the present embodiment, when a pressing force Fa was applied from above onto the curved electrode structure 100, the first contact surface 160 of the piezoelectric material layer 110 (refer to FIG. 1) of curved electrode structure 100 deforms due to the force Fa. As shown in FIG. 3A, the stress on the first contact surface 160 is distributed according to the circular shaped profile.

Figure 3B:
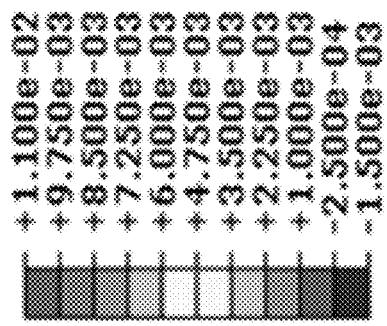
FIG. 3B is the stress distribution diagram when the conventional electrode structure of FIG. 1 is under pressure.
Figure 3B:
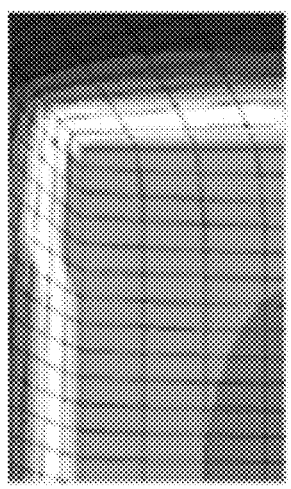

FIG. 3B is the stress distribution diagram when the conventional electrode structure is under pressure. Comparing to FIG. 3A, the stress accumulate at the turning position of the piezoelectric material layer when a pressing force Fa was applied from above onto the conventional electrode due to the lack of the circular shaped first contact surface 160, second contact surface 170, connection surface 180, and the sidewall 132.

In contrast, the curved electrode structure 100 of the present invention can effectively reduce the stress accumulated on the piezoelectric material layer 110 (refer to FIG. 1), reduce the cross-talk phenomena, and improve the precision and sensitivity in pressure sensing.

It is noted that, in the present embodiment, the magnitude of the stress distribution in FIG. 3A is merely an exemplary demonstration, but not limit the present invention. The stress magnitude of the piezoelectric material layer 110 of the curved electrode structure 100 of the present invention varies depend on the actual usage condition.

Figure 4:
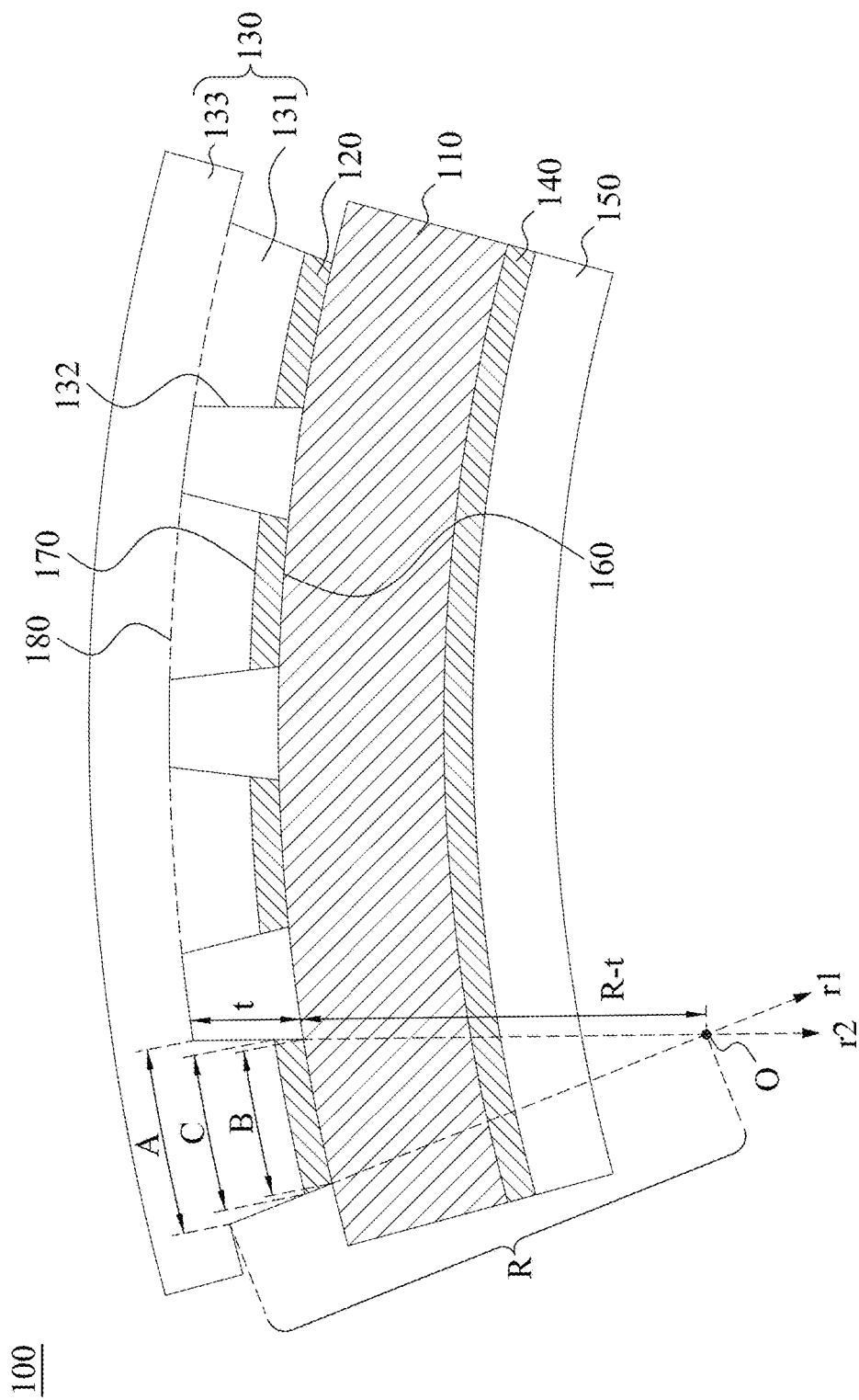
FIG. 4 is the cross-sectional view when the curved electrode structure of FIG. 1 is bent.

FIG. 4 is the cross-sectional view when the curved electrode structure of FIG. 1 is bent. As shown in FIG. 4, the curved electrode structure 100 includes the piezoelectric material layer 110, the first conductive layer 120, the first protective layer 130, the second conductive layer 140 and the second protective layer 150, which all have the same curvature when bent.

In the present embodiment, the first conductive layer 120 of the curved electrode structure 100 forms a circular-shaped configuration when viewed from above. The first contact surface 160 which is the location where the first conductive layer 120 and the piezoelectric material layer 110 contacts with each other has an arc length B. The second contact surface 170 which is the location where the first protective layer 130 and the first conductive layer 120 contacts with each other has an arc length C. The arc length C of the second contact surface 170 is greater than the arc length B of the first contact surface 160. In the present embodiment, widths of the curved surfaces of the first conductive layer 120 gradually increase form the first contact surface 160 to the second contact surface 170. In other words, the size of the configuration of the first conductive layer 120 when viewed from above gradually increase from the first contact surface 160 to the second contact surface 170.

Particularly, in the present embodiment, the connection surface 180 between the protruding portion 131 which located from the first contact surface 160 to the first protective layer 130 and the flat portion 133 has a thickness t, and the first contact surface 160, the second contact surface 170 and the connection surface 180 are parallel to each other. Lines r1, r2 which extend along the first conductive layer 120 and the sidewall 132 of the protruding portion 131 intersect at a center O. Length of the line from the position of the connection surface 180 to the center O is defined as the radius of curvature R of the connection surface 180 with the center O as the center of a circle, length of the line from the position of the first contact surface 160 to the center O is defined as the radius of curvature (R−t) of the first contact surface 160 with the center O as the center of a circle, and arc length B of the first contact surface 160, the arc length A of the connection surface 180, the radius of curvature (R−t) of the first contact surface 160, and the radius of curvature R of the connection surface 180 satisfy the relation: A(R−t)=BR.

Furthermore, for example, in the present embodiment, the arc lengths of any positions that located between the second contact surface 170 and the connection surface 180 are greater than the arc lengths of any positions that located between the first contact surface 160 and the second contact surface 170. The arc lengths and the radius of curvatures of any positions that located between the second contact surface 170 and the connection surface 180, and the arc lengths and the radius of curvatures of any positions that located between the first contact surface 160 and the second contact surface 170 satisfy the relation: A(R−t)=BR. In other words, within the region of the thickness t of the curved electrode structure, the arc lengths of any positions of the protruding portion 131 and the first conductive layer 120 are estimated through the same concentric curvature.

Particularly, when the curved electrode structure 100 is bent, the cross talk phenomena should be more obvious because the first conductive layer 120 and the protruding portion 131 of the first protective layer 130 located at the inner side of the curved surfaces would become closer to each other. However, other than reducing stress accumulation and avoiding unpredictable deformation when the piezoelectric material is under pressure by forming circular shaped first contact surface 160 of the curved electrode structure 100, designing the profile of the protruding portion 131 of the first protective layer 130 and the first conductive layer 120 based on the concentric curvature can further avoid the disturbance between each electrode unit, and reduce the cross talk phenomena when the curved electrode structure is bent. Therefore, the curved electrode structure of the present invention can improve the precision and the sensitivity in pressure sensing.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A curved electrode structure, comprising:
   a piezoelectric material layer;
   a first conductive layer disposed on the piezoelectric material layer, wherein each of the first conductive layer and the piezoelectric material layer has a first contact surface, and the first contact surface of the first conductive layer and the first contact surface of the piezoelectric material layer are in contact with each other and are both circular shaped;
   a first protection layer having a protruding portion and a flat portion, wherein the protruding portion is in contact with the first conductive layer, a sidewall of the protruding portion has a circular-shaped profile, the protruding portion is located between the flat portion and the first conductive layer, the flat portion completely overlaps with the piezoelectric material layer, the protruding portion has a first width at a position adjacent to the flat portion, the first conductive layer has a second width at a position adjacent to the piezoelectric material layer, and the first width is greater than the second width, wherein each of the first protection layer and the first conductive layer has a second contact surface, and the second contact surface of the first protection layer and the second contact surface of the first conductive layer are in contact with each other and are both circular shaped; and
   a second conductive layer, wherein the piezoelectric material layer is disposed between the second conductive layer and the first conductive layer.

2. The curved electrode structure of claim 1, wherein the first conductive layer forms a circular-shaped configuration when viewed from above.

3. The curved electrode structure of claim 1, wherein a distance is formed between the flat portion and the piezoelectric material layer, the protruding portion has a radius of curvature at a position adjacent to the flat portion, and A(R−t)=BR, where A is the first width, R is the radius of curvature, t is the distance, and B is the second width.

4. The curved electrode structure of claim 1, wherein a width of the first conductive layer and a width of the protruding portion are gradually increased from the piezoelectric material layer to the flat portion.

5. The curved electrode structure of claim 1, wherein when the curved electrode structure is bent, the piezoelectric material layer, the first conductive layer, the first protection layer, and the second conductive layer have a same curvature.

6. The curved electrode structure of claim 5, further comprising a second protection layer, wherein the second conductive layer is between the second protection layer and the piezoelectric material layer, and the second protection layer has the curvature.

7. The curved electrode structure of claim 1, wherein a contact area between the first protection layer and the first conductive layer is greater than a contact area between the first conductive layer and the piezoelectric material layer.

\* \* \* \* \*